United States Patent
Koyama et al.

(10) Patent No.: US 12,261,380 B2
(45) Date of Patent: Mar. 25, 2025

(54) SEMICONDUCTOR ELEMENT

(71) Applicant: Canon Kabushiki Kaisha, Tokyo (JP)

(72) Inventors: Yasushi Koyama, Kanagawa (JP); Noriyuki Kaifu, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 246 days.

(21) Appl. No.: 18/156,539

(22) Filed: Jan. 19, 2023

(65) Prior Publication Data
US 2023/0155292 A1 May 18, 2023

Related U.S. Application Data

(63) Continuation of application No. PCT/JP2021/026676, filed on Jul. 15, 2021.

(30) Foreign Application Priority Data

Jul. 27, 2020 (JP) ................. 2020-126353

(51) Int. Cl.
*H01Q 9/04* (2006.01)
*H01Q 1/22* (2006.01)
(Continued)

(52) U.S. Cl.
CPC ........... *H01Q 9/045* (2013.01); *H01Q 1/2283* (2013.01); *H01Q 21/0075* (2013.01);
(Continued)

(58) Field of Classification Search
CPC .. H01Q 9/045; H01Q 1/2283; H01Q 21/0075; H01Q 21/065; H01Q 23/00; H03B 7/08
See application file for complete search history.

(56) References Cited

U.S. PATENT DOCUMENTS

| | | | | |
|---|---|---|---|---|
| 4,686,535 A | * | 8/1987 | Lalezari | H01Q 21/065 343/700 MS |
| 2010/0134376 A1 | * | 6/2010 | Margomenos | H01Q 21/065 343/860 |
| 2021/0072350 A1 | * | 3/2021 | Loesch | G01S 13/878 |

FOREIGN PATENT DOCUMENTS

| | | |
|---|---|---|
| JP | 2014200065 A | 10/2014 |
| JP | 2016174291 A | 9/2016 |

(Continued)

OTHER PUBLICATIONS

Hidetoshi Kanaya et al., "Fundamental Oscillation up to 1.42 THz in Resonant Tunneling Diodes by Optimized Collector Spacer Thickness", J Infrared Milli Terahz Waves, (2014) 35:425-431.
(Continued)

*Primary Examiner* — Wei (Victor) Y Chan
(74) *Attorney, Agent, or Firm* — Venable LLP

(57) ABSTRACT

A semiconductor element comprising: an antenna array that is provided with a plurality of antennas each including a semiconductor layer having an electromagnetic wave gain or carrier nonlinearity with respect to a terahertz wave; and a coupling line that synchronizes adjacent antennas in the antenna array with each other at a frequency of the terahertz wave, wherein the coupling line includes a plurality of first regions connected to the adjacent antennas respectively and a second region provided between the plurality of first regions, wherein the second region has impedance different from impedance of each of the first regions, and wherein the second region has a loss larger than a loss of the individual first region at a frequency other than a resonance frequency of the antenna array.

20 Claims, 5 Drawing Sheets

(51) Int. Cl.
  *H01Q 21/00* (2006.01)
  *H01Q 21/06* (2006.01)
  *H01Q 23/00* (2006.01)
  *H03B 7/08* (2006.01)

(52) U.S. Cl.
  CPC .......... *H01Q 21/065* (2013.01); *H01Q 23/00* (2013.01); *H03B 7/08* (2013.01)

(56) References Cited

FOREIGN PATENT DOCUMENTS

| | | |
|---|---|---|
| JP | 6238505 B1 | 11/2017 |
| JP | 2017201779 A | 11/2017 |
| JP | 2019009761 A | 1/2019 |
| WO | 2017188363 A1 | 11/2017 |
| WO | 2018116506 A1 | 6/2018 |
| WO | 2019138603 A1 | 7/2019 |

OTHER PUBLICATIONS

Jenshan Lin et al., "Two-Dimensional Quasi-Optical Power-Combining Arrays Using Strongly Coupled Oscillators", IEEE Transactions on Microwave Theory and Techniques, vol. 42, No. 4, Apr. 1994.

M. Asada et al., "Theoretical analysis of coupled oscillator array using resonant tunneling diodes in subterahertz and terahertz range", Journal of Applied Physics, 103, 124514 (2008).

Masahiro Asada et al., "Resonant Tunneling Diodes for Sub-Terahertz and Terahertz Oscillators", Japanese Journal of Applied Physics, vol. 47, No. 6, 2008, pp. 4375-4384.

Nogi et al., "Mode Analysis and Stabilization of a Spatial Power Combining Array with Strongly Coupled Oscillators," IEEE Transactions on Microwave Theory and Techniques, No. 10, Oct. 1993, XP 000414481, pp. 1827-1836.

Extended European Search Report dated Aug. 7, 2024 in counterpart European Patent Appln. No. 21849068.

Japanese Office Action issued Jul. 2, 2024 in counterpart Japanese Patent Appln. No. 2020-126353.

* cited by examiner

SEMICONDUCTOR ELEMENT

CROSS-REFERENCE TO RELATED APPLICATIONS

This application is a Continuation of International Patent Application No. PCT/JP2021/026676, filed on Jul. 15, 2021, which claims the benefit of Japanese Patent Application No. 2020-126353, filed on Jul. 27, 2020, both of which are hereby incorporated by reference herein in their entirety.

BACKGROUND OF THE INVENTION

Field of the Invention

The present invention relates to a semiconductor element that oscillates or detects a terahertz wave.

Background Art

As a current-injection-type light source that generates terahertz waves, which are electromagnetic waves in a frequency range of at least 30 GHz and not more than 30 THz, an oscillator, in which a semiconductor element having an electromagnetic gain of terahertz waves and a resonator are integrated, has been known. In particular, an oscillator, in which a resonant tunneling diode (RTD) and an antenna are integrated, is expected to be used as a semiconductor element that operates at room temperature in a frequency range around 1 THz.

Non Patent Literature (NPL) 1 describes a terahertz wave oscillator in which an RTD and a slot antenna resonator are integrated on a semiconductor substrate. In NPL 1, a double-barrier-type RTD is used that includes an InGaAs quantum well layer and an AlAs tunnel barrier layer epitaxially grown on an InP substrate. The oscillator using such an RTD can implement oscillation of terahertz waves at room temperature in a region in which differential negative resistance is obtained in voltage-current (V-I) characteristics.

Patent Literature (PTL) 1 describes a terahertz wave antenna array in which a plurality of oscillators each having an RTD and an antenna integrated therein are arranged on the same substrate. The antenna array described in PTL 1 can enhance antenna gain and power by synchronizing adjacent antennas with each other. NPL 2 describes a configuration in which adjacent antennas are connected to each other by a chip resistor to achieve mode stabilization.

However, since the number of modes (the number of resonance frequency bands) to be synchronized increases in conjunction with an increase in the number of antennas (the number of negative resistance elements) in the antenna array, it becomes more difficult for the element to stabilize generation or detection of terahertz waves as the number of antennas increases. Consequently, there are cases in which the element including a plurality of antennas cannot efficiently generate or detect a terahertz wave because there are a plurality of modes to be synchronized.

With the foregoing in view, it is an object of the present invention to implement more efficient generation or detection of a terahertz wave by an element including a plurality of antennas.

CITATION LIST

Patent Literature

PTL 1: Japanese Patent Application Publication No. 2014-200065

Non Patent Literature

NPL 1: Jpn.J.Appl.Phys., Vol. 47, No. 6 (2008), pp. 4375-4384

NPL 2: IEEE TRANSACTIONS ON MICROWAVE THEORY AND TECHNIQUES, VOL. 42, NO. 4, APRIL 1994

NPL 3: J.Appl.Phys., Vol. 103, 124514 (2008)

NPL 4: J Infrared Milli Terahz Waves (2014) 35:425-431

SUMMARY OF THE INVENTION

The first aspect of the invention is a semiconductor element comprising: an antenna array that is provided with a plurality of antennas each including a semiconductor layer having an electromagnetic wave gain or carrier nonlinearity with respect to a terahertz wave; and a coupling line that synchronizes adjacent antennas in the antenna array with each other at a frequency of the terahertz wave, wherein the coupling line includes a plurality of first regions connected to the adjacent antennas respectively and a second region provided between the plurality of first regions, wherein the second region has impedance different from impedance of each of the first regions, and wherein the second region has a loss larger than a loss of the individual first region at a frequency other than a resonance frequency of the antenna array.

The second aspect of the invention is a semiconductor element comprising: an antenna array that is provided with a plurality of antennas each including a semiconductor layer having an electromagnetic wave gain or carrier nonlinearity with respect to a terahertz wave; and a coupling line that synchronizes adjacent antennas in the antenna array with each other at a frequency of the terahertz wave, wherein the coupling line includes first regions connected to the adjacent antennas respectively and a second region provided between the first regions, wherein the second region has impedance different from impedance of each of the first regions, and wherein a loss difference between the individual first region and the second region at a resonance frequency of the antenna array is smaller than a loss difference between each of the first regions and the second region at a frequency other than the resonance frequency of the antenna array.

Further features of the present invention will become apparent from the following description of exemplary embodiments with reference to the attached drawings.

DESCRIPTION OF THE EMBODIMENTS

Embodiment 1

Hereinafter, a semiconductor element 100 according to Embodiment 1 will be described. The semiconductor element 100 generates (oscillates) or detects a terahertz wave (an electromagnetic wave in a frequency range of at least 30 GHz and not more than 30 THz) having a frequency (resonance frequency; oscillation frequency) $f_{THz}$. In the following description, an example in which the semiconductor element 100 is used as an oscillator will be described. The length of each component in a lamination direction of the semiconductor element 100 is referred to as "thickness" or "height".

Description of Circuit Configuration of Semiconductor Element

Figure 1A:
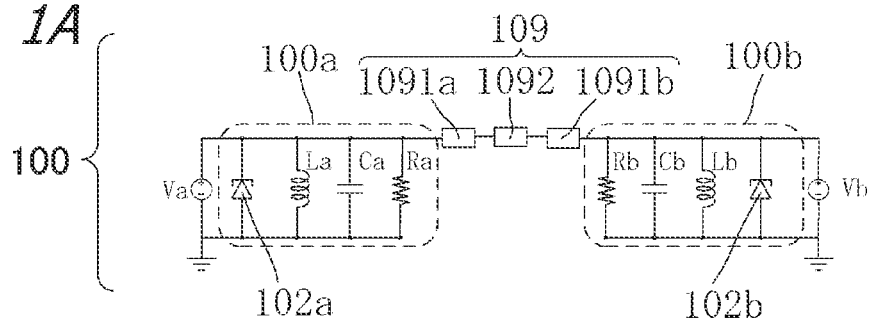
FIGS. 1A to 1D illustrate semiconductor element circuits according to Embodiment 1.

First, a circuit configuration of the semiconductor element 100 will be described below. FIG. 1A illustrates an equivalent circuit of the semiconductor element 100. FIG. 1D illustrates an equivalent circuit of bias circuits $V_a$ and $V_b$ included in the semiconductor element 100.

The semiconductor element 100 includes an antenna array provided with a plurality of antennas. In the present embodiment, the semiconductor element 100 includes an antenna array in which an antenna 100a and an antenna 100b are provided adjacent to each other. The antenna 100a serves as both a resonator for resonating terahertz waves and a radiator for transmitting or receiving terahertz waves and includes a semiconductor 102a therein for generating or detecting terahertz waves (electromagnetic waves). The antenna 100b has the same configuration as that of the antenna 100a. Hereinafter, the configuration of the antenna 100a will be described in detail, and detailed descriptions of the same constituent elements of the antenna 100b as those of the antenna 100a will be omitted.

While the semiconductor element 100 provided with two antennas will be described in the present embodiment, the number of antennas may be three or more. For example, an array in which antennas are arranged in a 3×3 matrix or a linear array in which three antennas are linearly arranged in a vertical or horizontal direction may be used. The semiconductor element 100 may have an antenna array in which antennas are arranged in an m×n matrix (m≥2, n≥2). These antennas may be arranged at a pitch that is an integer multiple of the wavelength of the terahertz wave having a frequency $f_{THz}$.

In the following description, at each end of the reference numerals of constituent members belonging to the antenna 100a and the antenna 100b, an alphabet indicating the corresponding antenna is added. More specifically, "a" is added to the end of the reference numerals of the constituent member included in the antenna 100a, and "b" is added to the end of the reference numerals of the constituent member included in the antenna 100b.

As illustrates in FIG. 1A, in the antenna 100a, the semiconductor 102a, a resistor $R_a$, which is determined by radiation and a conductive loss of the antenna, and LC components (a capacitor $C_a$ and an inductor $L_a$), which is determined by a structure, are connected in parallel. In addition, a bias circuit $V_a$ for supplying a bias signal to the semiconductor 102a is connected in parallel with the semiconductor 102a.

The semiconductor 102a has an electromagnetic wave gain or carrier nonlinearity (nonlinearity of a current corresponding to a voltage change in current-voltage characteristics) with respect to a terahertz wave. In the present embodiment, a resonant tunneling diode (RTD), which is a typical semiconductor having an electromagnetic wave gain in a frequency band of the terahertz wave, is used as the semiconductor 102a. The semiconductor 102a includes a circuit in which differential negative resistance and diode capacitance of the RTD are connected in parallel (not illustrated).

Similarly to the antenna 100a, the antenna 100b is constituted by a circuit in which a semiconductor 102b, a resistor $R_b$, LC components ($C_b$ and $L_b$), and a bias circuit $V_b$ are connected in parallel. Each antenna individually transmits or receives a terahertz wave having a frequency $f_{THz}$.

The bias circuit $V_a$ includes a power supply for supplying a bias signal to the semiconductor 102a of the antenna 100a and a stabilization circuit, and the bias circuit $V_b$ includes a power supply for supplying a bias signal to the semiconductor 102b of the antenna 100b and a stabilization circuit. As illustrated in FIG. 1D, the bias circuits $V_a$ and $V_b$ include a shunt resistor 121, a wiring 122, a power supply 123, and a capacitor 124 respectively.

The shunt resistor 121 is connected in parallel with the semiconductor 102a/102b. The capacitor 124 is connected in parallel with the shunt resistor 121. The power supply 123 supplies a current needed for driving the semiconductor 102a/102b and adjusts a bias signal corresponding to the semiconductor 102a/102b. When an RTD is used for the semiconductor 102a/102b, the bias signal is selected from voltages in a differential negative resistance region of the RTD. The shunt resistor 121 and the capacitor 124 of the bias circuit $V_a/V_b$ reduces parasitic oscillation of a relatively low resonance frequency (typically in a frequency band from DC to 10 GHz) caused by the bias circuit $V_a/V_b$.

Adjacent antennas 100a and 100b are coupled to each other by a coupling line 109. The coupling line 109 reduces occurrence of multi-mode resonance and realizes efficient generation or detection of a terahertz wave. Hereinafter, a configuration of the coupling line 109 will be described in more detail.

Description of Configuration of Coupling Line

The coupling line 109 includes a plurality of first regions connected to the respective adjacent antennas and a second region provided between the plurality of first regions. More specifically, the coupling line 109 includes a first region 1091a connected to the antenna 100a, a first region 1091b connected to the antenna 100b, and a second region 1092 provided between the first regions 1091a and 1091b.

The second region 1092 has impedance different from that of the first regions 1091a and 1091b, and a loss of the second region 1092 is larger than that of the first regions 1091a and 1091b at a frequency other than the resonance frequency of the antenna array.

In addition, a loss difference between the first regions 1091a and 1091b and the second region 1092 at a resonance frequency of the antenna array is smaller than a loss difference between the first regions 1091a and 1091b and the second region 1092 at a frequency other than the resonance frequency of the antenna array. At the resonance frequency of the antenna array, a loss difference between the first regions 1091a and 1091b and the second region 1092 may be smaller than a predetermined threshold. As the predetermined threshold, a value that indicates that there is practically no difference between the losses can be adopted.

Further, when the phase of a component in the resonance frequency of the antenna array is shifted in the electromagnetic field that synchronizes the adjacent antennas 100a and 100b, the loss of the second region 1092 is larger than that of the first regions 1091a and 1091b for such a component.

As described above, since the coupling line 109 includes the second region 1092 having impedance different from that of the first regions 1091a and 1091b, only a frequency other than a desired operating frequency $f_{THz}$ of the terahertz wave and an out-of-phase component of the operating frequency $f_{THz}$ are selectively lost. As a result, occurrence of resonance (multi-mode resonance) in a plurality of frequency bands and asynchronization due to a phase shift between the antennas are reduced.

From the viewpoint of the radiation efficiency of the antenna, the second region 1092 is preferably disposed (connected) at a position corresponding to the antinode of the electric field of a terahertz wave having a resonance frequency $f_{THz}$ standing in the coupling line 109. Here, the "position corresponding to the antinode of the electric field of a terahertz wave having a resonance frequency $f_{THz}$ standing in the coupling line 109" refers to, for example, a position where the electric field intensity of the terahertz wave having the resonance frequency $f_{THz}$ standing in the coupling line 109 is maximized. In other words, the position refers to a position where the current intensity of the terahertz wave having the resonance frequency $f_{THz}$ standing in the coupling line 109 decreases by approximately one digit.

The impedance of the second region 1092 of the coupling line 109 is selected to be a value in a range from a value equal to or slightly smaller than an absolute value of the differential negative resistance of the connected semiconductors 102a and 102b to a value approximately 100 times the absolute value. Considering that a typical value of the negative resistance of the RTD used in the terahertz band is in a range of 0.1 to 1000Ω, the value of the impedance of the second region 1092 is set in a range of 0.1 to 100 kΩ.

Figure 1B:
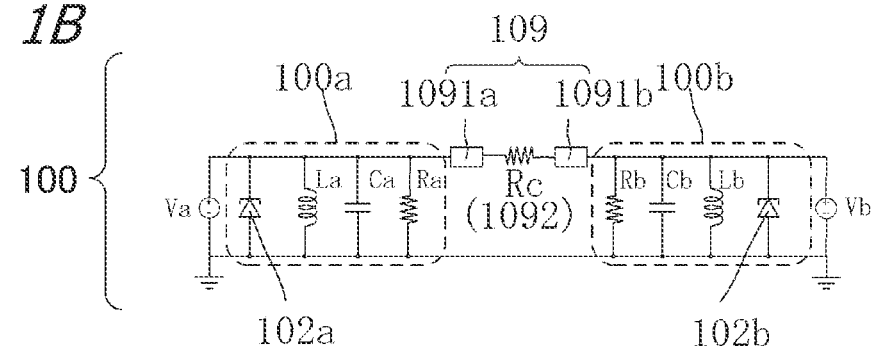

FIG. 1B illustrate s a modification of the equivalent circuit of the semiconductor element 100. In this example, a thin-film resistor $R_c$ is connected between the first regions 1091a and 1091b, which are transmission lines, as an upper conductor of the second region 1092. A value for the resistor $R_c$ is selected to be a value in a range from a value equal to or slightly smaller than an absolute value of the differential negative resistance of the connected semiconductors 102a and 102b to a value approximately 100 times the absolute value. Considering that a typical value of the negative resistance of the RTD used in the terahertz band is in a range of 0.1 to 1000Ω, the value of the resistor $R_c$ is set in a range of 1 to 100 kΩ.

Figure 1C:
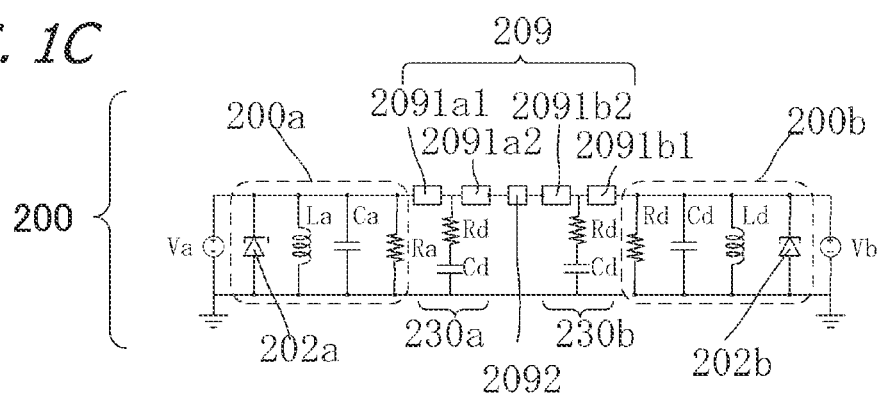
Figure 1D:
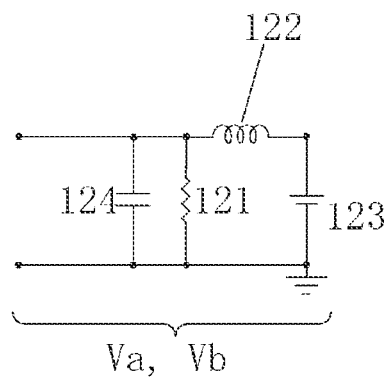

FIG. 1C illustrates an equivalent circuit of a semiconductor element 200 as a modification of the present embodiment. The semiconductor element 200 has an antenna 200a including a semiconductor 202a and an antenna 200b including a semiconductor 202b that are coupled to each other by a coupling line 209. In the present modification, the coupling line 209 includes first regions 2091a1, 2091a2, 2091b1, and 2091b2 and a second region 2092 provided between the first regions 2091a2 and 2091b2.

The coupling line 209 is connected to shunt elements 230a and 230b connected in parallel with semiconductors 202a and 202b, respectively. Since the shunt elements 230a and 230b are arranged in this manner, short circuit is achieved for a terahertz wave having a frequency other than a desired operating frequency $f_{THz}$ of the terahertz wave so that the impedance of the semiconductor element 200 is lowered at such a frequency. As described in the present modification, by disposing the shunt elements in addition to having the second region 2092 that has impedance different from that of the first regions, the effect of reducing the occurrence of resonance (multi-mode resonance) in a plurality of frequency bands is further enhanced.

From the viewpoint of radiation efficiency of the antennas, the shunt elements 230a and 230b are preferably disposed (connected) at positions corresponding to the nodes of the electric field of a terahertz wave having a resonance frequency $f_{THz}$ standing in the coupling line 109. Here, the "positions corresponding to the nodes of the electric field of a terahertz wave having a resonance frequency $f_{THz}$ standing in the coupling line 209" refer to, for example, positions where the electric field intensity of the terahertz wave having the resonance frequency $f_{THz}$ standing in the coupling line 209 decreases by approximately one digit.

As illustrated in FIG. 1C, the shunt elements 230a and 230b each include a resistor $R_d$ and a capacitor $C_d$ connected in series. A value for the resistor $R_d$ is selected to be a value equal to or slightly smaller than an absolute value of the combined differential negative resistance of the semiconductors 202a and 202b connected in parallel. Further, a value of the capacitor $C_d$ is set to have impedance equal to or slightly lower than an absolute value of the combined differential negative resistance of the semiconductors 202a and 202b connected in parallel. That is, it is preferable that each of the values of the resistor $R_d$ and the capacitor $C_d$ be set to have impedance lower than an absolute value of the negative resistance (impedance) corresponding to the gains of the semiconductors 202a and 202b. Considering that a typical value of the negative resistance of the RTD used in the terahertz band is in a range of 0.1 to 1000Ω, the value of the resistor $R_d$ is set in a range of 0.1 to 1000 Ω. To obtain a shunt effect in a frequency range from 10 GHz to 1000 GHz, the value of the capacitor $C_d$ is typically set in a range of 0.1 to 1000 pF. The condition of the impedance of the resistor $R_d$ and the capacitor $C_d$ with respect to the negative resistance of the RTD is satisfied in a frequency band lower than the resonance frequency $f_{THZ}$.

FIGS. 2A to 2D illustrate specific configurations of the coupling line 109 of the semiconductor element according to Embodiment 1. The coupling line 109 is constituted by a microstrip line having a structure in which a dielectric layer 104 is sandwiched between an upper conductor (third conductor layer) laminated on the dielectric layer 104 and a first conductor layer 106 serving as GND. In the semiconductor element 100, in order to synchronize adjacent antennas with each other at the resonance frequency $f_{THz}$, the antennas are coupled by DC coupling. That is, third layers 110a and 110b, which are upper conductors of the coupling line 109 that couple the antennas 100a and 100b, are directly connected to patch conductors of the antennas 100a and 100b (second conductor layers 103a and 103b in FIG. 3A). In the semiconductor element 100, the third conductor layers 110a and 110b and the second conductor layers 103a and 103b are formed in the same layer.

Figure 2A:
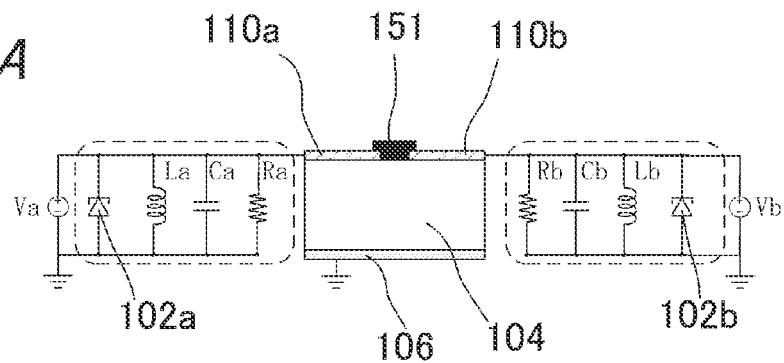
FIGS. 2A to 2D illustrate configurations of a semiconductor element 100.

FIG. 2A illustrates a configuration example of the coupling line 109. In the present example, the first regions 1091a and 1091b in the coupling line 109 are the microstrip line and have a structure in which the dielectric layer 104 is sandwiched between the third conductor layers 110a and 110b and the first conductor layer 106. The second region 1092 is a stripline and has a structure in which the dielectric layer 104 is sandwiched between the upper conductor of the third conductor layer (resistance layer) 151 and the first conductor layer 106. The resistance layer 151 is disposed between the third conductor layers 110a and 110b and is electrically and physically connected to each of the third conductor layers 110a and 110b, thereby forming the coupling line 109 (microstrip line) that couples the antennas 100a and 100b.

Since the upper conductors of the first regions 1091a and 1091b are low-resistance conductor layers and the upper conductor of the second region 1092 is a high-resistance resistor, the second region 1092 has impedance higher than that of the first regions 1091a and 1091b and has a large loss at a high frequency. Typically, the effect of the present disclosure can be obtained when the impedance of the second region 1092 is on the order of 2 times to 100 times the impedance of the first regions 1091a and 1091b. For example, the value of the impedance is set in a range of 1 to 100 kΩ.

Conventionally, the coupling line is composed of lines having the same characteristic impedance and does not have a function of selecting a frequency. However, in the semiconductor element 100 according to the present disclosure, lines having different impedance are arranged depending on the electric field distribution of the lines so that a loss is selectively given at a frequency other than a specific frequency and phase.

Figure 2B:
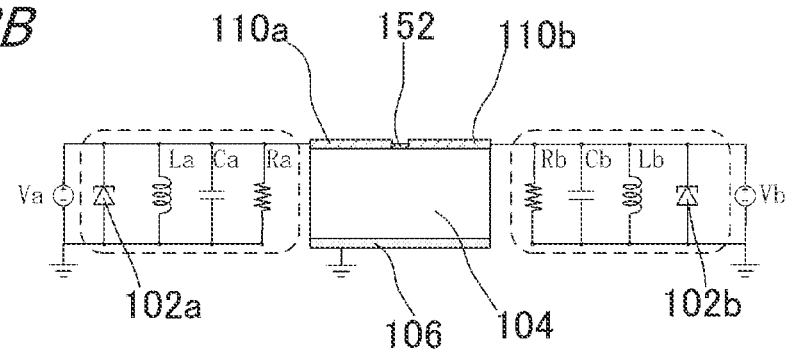

FIG. 2B illustrates another configuration example of the coupling line 109. In the present example, the upper conductor of the second region is a conductor layer 152 that is made of the same material as the third conductor layers 110a and 110b and is thin and narrow. The conductor layer 152 is disposed between the third conductor layers 110a and 110b and electrically connected to each of the third conductor layers 110a and 110b. In this case, too, since the resistance of the conductor layer 152 is higher, the second region 1092 has impedance higher than that of the first regions 1091a and 1091b and has a larger loss at a high frequency. As long as the second region 1092 has higher impedance, the conductor layer 152 may have a configuration that only satisfies either the condition that the conductor layer 152 is thinner or the condition that the conductor layer 152 is narrower compared with the third conductor layers 110a and 110b.

Figure 2C:
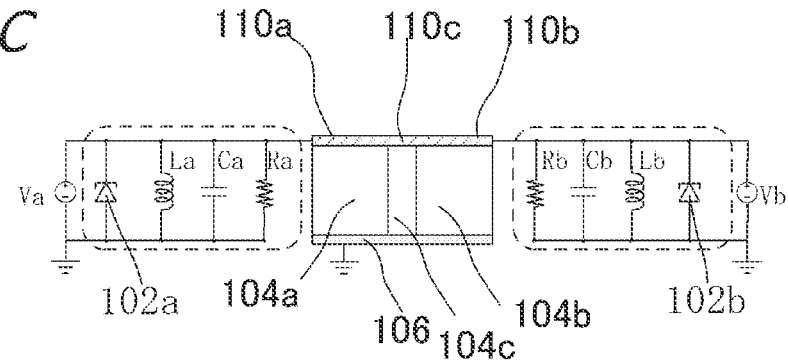

FIG. 2C illustrates still another configuration example of the coupling line 109. The coupling line 109 of the present example includes dielectrics 104a and 104b each having a small loss at a high frequency in the first regions 1091a and 1091b, respectively, and a dielectric 104c having a large loss at a high frequency in the second region 1092. Specifically, the dielectric 104c in the second region 1092 is made of a material having a larger loss at a high frequency compared with the dielectrics 104a and 104b in the first regions 1091a and 1092b. In this configuration, too, the second region 1092 has impedance higher than that of the first regions 1091a and 1091b and has a larger loss at a high frequency.

Figure 2D:
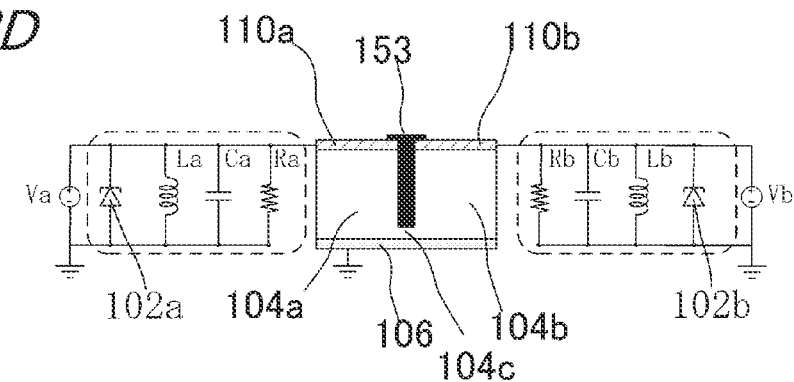

FIG. 2D illustrates still another configuration example of the coupling line 109. The coupling line 109 of the present example includes thick dielectrics 104a and 104b in the first regions 1091a and 1091b, respectively, and includes a thin dielectric 104c in the second region 1092. Typically, each of the dielectrics 104a and 104b preferably has a layer thickness in a range of 1 to 30 μm. Typically, the dielectric 104c preferably has a layer thickness in a range of 0.01 to 1 μm, which is thinner than the dielectrics 104a and 104b. As described above, the second region 1092 is a line having a low-impedance structure that generates a leakage electric field due to a capacitance structure in which the thin dielectric 104c is sandwiched between a conductor 153 and the first conductor layer 106. By using such a low-impedance line as the second region 1092, a configuration in which the loss of the second region 1092 is larger than that of the first regions 1091a and 1091b can be realized. Typically, the dielectric 104c preferably has a thickness in a range of 0.01 to 1 μm.

Description of Structure of Semiconductor Element

Figure 3A:
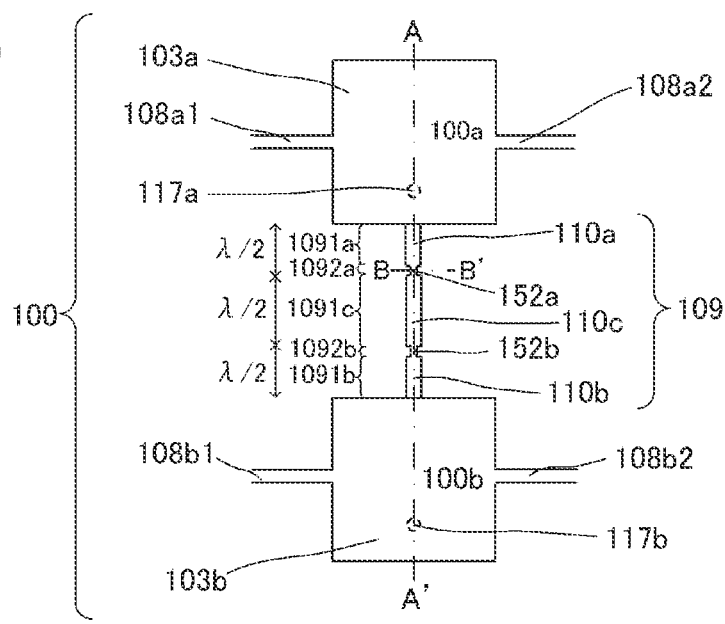
FIGS. 3A to 3C illustrate a configuration of the semiconductor element 100.
Figure 3B:
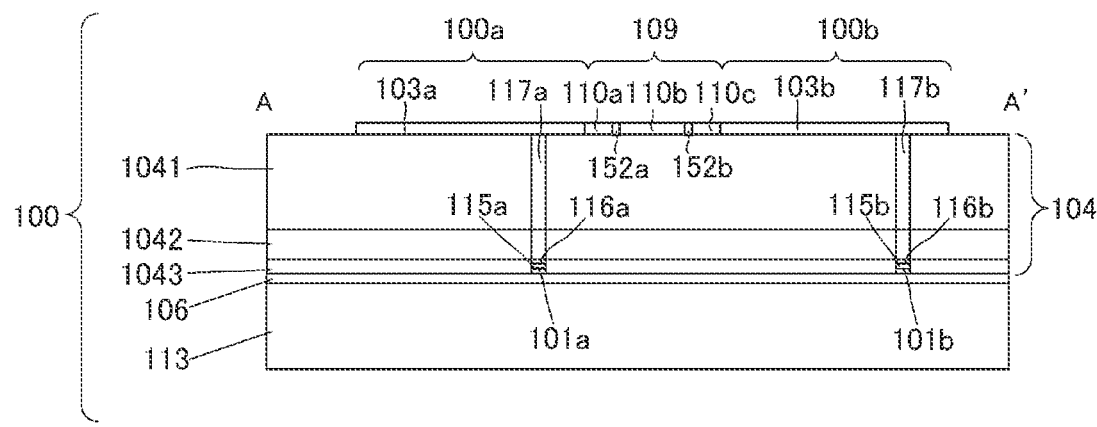
Figure 3C:
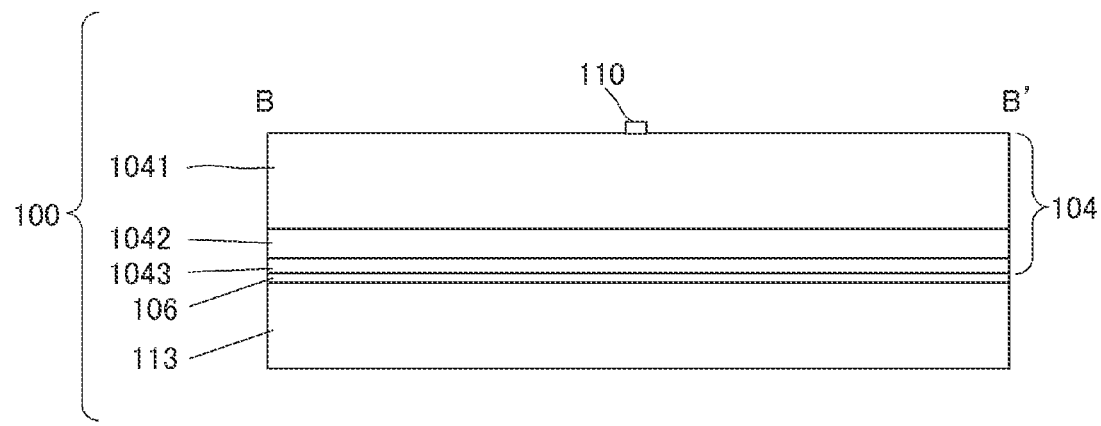

A specific structure of the semiconductor element 100 will be described with reference to FIGS. 3A to 3C. FIG. 3A is a top view of the semiconductor element 100. FIG. 3B is a cross-sectional view of the semiconductor element 100, taken along line A-A' in FIG. 3A, and FIG. 3C is a cross-sectional view of the semiconductor element 100, taken along line B-B' in FIG. 3A.

The antenna 100a includes a substrate 113, a first conductor layer 106, a semiconductor layer 115a, an electrode 116a, a conductor 117a, a dielectric layer 104, and a second conductor layer 103a. As illustrated in FIG. 3B, the antenna 100a has a configuration in which the dielectric layer 104 composed of three layers of a first dielectric layer 1041, a second dielectric layer 1042, and a third dielectric layer 1043 is sandwiched between two conductors, which are the first conductor layer 106 and the second conductor layer 103a. Such a configuration is known as a microstrip antenna. In the present embodiment, an example in which the antennas 100a and 100b are used as patch antennas, which are typical microstrip resonators, will be described.

The second conductor layer 103a is a patch conductor of the antenna 100a and is disposed so as to face the first conductor layer 106 via the dielectric layer 104 (semiconductor layer 115a). The second conductor layer 103a is electrically connected to the semiconductor layer 115a. The antenna 100a is set to be a resonator in which the second conductor layer 103a has a width of $\lambda_{THz}/2$ in an A-A' direction (resonance direction). The first conductor layer 106 is a ground conductor and is electrically grounded. Here, $\lambda_{THz}$ is an effective wavelength of a terahertz wave resonating in the dielectric layer 104 of the antenna 100a and is expressed by $\lambda_{THz} = \lambda_0 \times \varepsilon_r^{-1/2}$, where $\lambda_0$ is a wavelength of the terahertz wave in vacuum, and $\varepsilon_r$ is an effective relative permittivity of the dielectric layer 104.

The semiconductor layer 115a corresponds to the semiconductor 102a of the equivalent circuit illustrated in FIG. 1A and includes an active layer 101a constituted by a semiconductor having an electromagnetic wave gain or carrier nonlinearity with respect to a terahertz wave. In the present embodiment, an example in which an RTD is used as the active layer 101a will be described. Hereinafter, the active layer 101a will be described as an RTD 101a.

The semiconductor layer 115a is disposed on the first conductor layer 106 laminated on the substrate 113, and the semiconductor layer 115a and the first conductor layer 106 are electrically connected to each other. Note that the semiconductor layer 115a and the first conductor layer 106 are preferably connected to each other with low resistance so that ohmic loss is reduced.

The RTD 101a has a resonant tunneling structure layer including a plurality of tunnel barrier layers. The RTD 101a has a multi-quantum-well structure in which a quantum-well layer is provided between a plurality of tunnel barriers and terahertz waves are generated by intersubband transition of carriers. The RTD 101a has an electromagnetic wave gain in a frequency range of terahertz waves based on a photon-assisted tunneling phenomenon in a differential negative resistance region of current-voltage characteristics and self-oscillates in the differential negative resistance region. The RTD 101a is disposed at a position shifted from the center of gravity of the second conductor layer 103a by 40% in the resonance direction (that is, the A-A' direction).

The antenna 100a is an active antenna in which the semiconductor layer 115a including the RTD 101a and a patch antenna are integrated. A frequency $f_{THz}$ of the terahertz wave oscillated singly from the antenna 100a is determined as the resonance frequency for all parallel resonance circuits in each of which the reactance of the patch antenna and the reactance of the semiconductor layer 115a are combined. Specifically, based on the equivalent circuit of the oscillator described in NPL 1, a frequency that satisfies an amplitude condition expressed by Equation (1) and a phase condition expressed by Equation (2) is determined as the resonance frequency $f_{THz}$ for the resonance circuit in which the admittance of the RTD and the admittance of the antenna ($Y_{RTD}$ and $Y_{aa}$) are combined.

$$Re[Y_{RTD}] + Re[Y_{aa}] \leq 0 \quad (1)$$

$$Im[Y_{RTD}] + Im[Y_{aa}] = 0 \quad (2)$$

In the above equations, $Y_{RTD}$ represents the admittance of the semiconductor layer 115a, Re represents a real part, and Im represents an imaginary part. Since the semiconductor layer 115a includes the RTD 101a, which is a negative resistance semiconductor element, as an active layer, $Re[Y_{RTD}]$ has a negative value. $Y_{aa}$ represents the total admittance of the antenna 100a viewed from the semiconductor layer 115a. Therefore, the components $R_a$, $C_a$, and $L_a$ of the antenna in the equivalent circuit in FIG. 1A are the main circuit elements of $Y_{aa}$, and the differential negative resistance and diode capacitance of the semiconductor 102a are the main circuit elements of $Y_{RTD}$.

As another example of the active layer 101a, a quantum-cascade laser (QCL) having a multi-layer structure of several hundreds to several thousands of semiconductor layers may be used. In this case, the semiconductor layer 115a is a semiconductor layer including a QCL structure. As the active layer 101a, a negative resistance semiconductor element such as a Gunn diode or an impact avalanche and transit time (IMPATT) diode, which is often used in a millimeter-wave band, may be used. In addition, as the active layer 101a, a high-frequency element such as a transistor having one terminal terminated may be used. For example, a heterojunction bipolar transistor (HBT), a compound semiconductor-based field-effect transistor (FET), a high-electron-mobility transistor (HEMT), or the like is preferable. Further, as the active layer 101a, a differential negative resistance of a Josephson device using a superconductor may be used.

The desirable dielectric layer 104 is capable of forming a thick film (typically, a film having a thickness of 3 μm or more), has a low loss and low permittivity in a terahertz band, and has excellent fine processability (processability by planarization or etching). In a microstrip resonator such as a patch antenna, by increasing the thickness of the dielectric layer 104, conductor loss can be reduced, and radiation efficiency can be improved. The thicker the dielectric layer 104 is, the greater the radiation efficiency becomes. However, if the dielectric layer 104 is too thick, multi-mode resonance occurs. Therefore, the thickness of the dielectric layer 104 is preferably one-tenth or less of the oscillation wavelength.

Miniaturization of the diode and higher current density are needed to achieve higher frequency and higher output of the oscillator. For this reason, the dielectric layer 104 is also expected to reduce leakage current and to take measures against migration as an insulating structure of the diode. In the present embodiment, to satisfy these objects, the dielectric layer 104 includes a first dielectric layer 1041 and a second dielectric layer 1042, which are two types of dielectric layers made of different materials.

An organic dielectric material such as BCB (benzocyclobutene, manufactured by the Dow Chemical Company, $\varepsilon_{r1}=2$, where, $\varepsilon_{r1}$ is relative permittivity of the first dielectric layer 1041), polytetrafluoroethylene, or polyimide is preferably used for the first dielectric layer 1041. The first dielectric layer 1041 may be made of an inorganic dielectric material such as a TEOS oxide film or spin-on-glass, which can be formed to be relatively thick and has low permittivity.

The second dielectric layer 1042 is expected to have an insulating property (a property of behaving as an insulator or a high-resistance resistor that does not conduct electricity with respect to a DC voltage), a barrier property (a property of preventing diffusion of a metal material used for an electrode), and processability (a property of being processable with submicron accuracy). To satisfy these properties, an inorganic insulating material such as silicon oxide ($\varepsilon_{r2}=4$), silicon nitride ($\varepsilon_{r2}=7$), aluminum oxide, or aluminum nitride is preferably used for the second dielectric layer 1042. Here, $\varepsilon_{r2}$ is relative permittivity of the second dielectric layer 1042.

From the viewpoint of impedance matching between the antenna and air (space), it is preferable that the permittivity difference between the antenna and the air be small. Thus, the first dielectric layer 1041 is preferably made of a material that is different from that of the second dielectric layer 1042 and that has relative permittivity lower than that of the second dielectric layer 1042 ($\varepsilon_{r1}<\varepsilon_{r2}$).

The electrode 116a is disposed on the opposite side of the semiconductor layer 115a from the side on which the first conductor layer 106 is disposed. The electrode 116a and the semiconductor layer 115a are electrically connected to each other. The semiconductor layer 115a and the electrode 116a are embedded in the second dielectric layer 1042 (the second dielectric layer 1042 and the third dielectric layer 1043). More specifically, the peripheries of the semiconductor layer 115a and the electrode 116a are covered with the second dielectric layer 1042 (the second dielectric layer 1042 and the third dielectric layer 1043).

The conductor layer ohmically connected to the semiconductor layer 115a is suitable for the electrode 116a to reduce ohmic loss and RC delay caused by series resistance. When the electrode 116a is used as an ohmic electrode, for example, Ti/Pd/Au, Ti/Pt/Au, AuGe/Ni/Au, TiW, Mo, ErAs, or the like is suitably used as the material of the electrode 116a.

In addition, when the region of the semiconductor layer 115a that is in contact with the electrode 116a is a semiconductor doped with an impurity at a high concentration, the contact resistance can be further reduced, which is suitable for achieving higher output and higher frequency. Since an absolute value of negative resistance indicating the magnitude of a gain of the RTD 101a used in a terahertz band is typically on the order of 1 to 100Ω, the loss of electromagnetic waves may be reduced to 1% or less. Thus, the contact resistance in the ohmic electrode may be reduced to 1Ω or less as a target.

In addition, in order to operate in the terahertz band, the width of the semiconductor layer 115a electrode 116a) is set to approximately 0.1 to 5 µm as a typical value. Thus, the resistivity is set to 10Ω·µm² or less, and the contact resistance is suppressed to a range of 0.001 to several Ω. As another embodiment, the electrode 116a may be made of metal that is not ohmic but Schottky-connected. In this case, a contact interface between the electrode 116a and the semiconductor layer 115a exhibits a rectifying property, and the antenna 100a has a suitable configuration to be a detector for terahertz waves. In the following description of the present embodiment, an ohmic electrode is used as the electrode 116a.

In the lamination direction from the RTD101a, as illustrated in FIG. 2B, the first conductor layer 106, the semiconductor layer 115a, the electrode 116a, the conductor 117a, and the second conductor layer 103a are laminated in this order from the substrate 113 side.

The conductor 117a is formed inside the dielectric layer 104, and the second conductor layer 103a and the electrode 116a are electrically connected via the conductor 117a. If the width of the conductor 117a is too large, the resonance characteristics of the antenna 100a are deteriorated, and the radiation efficiency is reduced due to an increase in parasitic capacitance. Therefore, it is preferable that the conductor 117a have a width that does not interfere with the resonance electric field, that is, typically, λ/10 or less is suitable. Further, the width of the conductor 117a can be reduced to such an extent that the series resistance is not increased, that is, to approximately twice the skin depth, as a guide. Considering that the series resistance is reduced to a level not exceeding 1Ω, the width of the conductor 117a is typically in a range of at least 0.1 µm and not more than 20 µm, as a guide.

A structure that electrically connects upper and lower layers, as with the conductor 117a, is called a via. The first conductor layer 106 and the second conductor layer 103a serve not only as members that constitute the patch antenna but also as electrodes for injecting a current into the RTD 101a by being connected to the via. The conductor 117a is preferably made of a material having a resistivity of 1× $10^{-6}$ Ω·m or less. Specifically, metals and metallic compounds such as Ag, Au, Cu, W, Ni, Cr, Ti, Al, an AuIn alloy, and TiN are preferably used as the material of the conductor 117a.

The second conductor layer 103a is connected to lines 108a1 and 108a2. The lines 108a1 and 108a2 are lead lines each connected to a bias line including the bias circuit $V_a$. The width of each of the lines 108a1 and 108a2 is set to be narrower than that of the second conductor layer 103a. Here, the width refers to a width in the resonance direction (=A-A' direction) of an electromagnetic wave in the antenna 100a. For example, the width of the line 108a1/108a2 is preferably equal to or less than one-tenth of the effective wavelength λ. (λ/10 or less) of the terahertz wave having the resonance frequency $f_{THz}$ standing in the antenna 100a. This is because, from the viewpoint of improving the radiation efficiency, it is preferable that the lines 108a1 and 108a2 have such dimensions and be disposed at such positions that do not interfere with the resonance electric field in the antenna 100a.

The lines 108a1 and 108a2 are preferably disposed at nodes of the electric field of a terahertz wave having a resonance frequency $f_{THz}$ standing in the antenna 100a. The lines 108a1 and 108a2 have impedance sufficiently higher than an absolute value of the differential negative resistance of the RTD 101a in the frequency band near the resonance frequency $f_{THz}$. In other words, the lines 108a1 and 108a2 are connected to the antenna so as to have high impedance with respect to the RTD at the resonance frequency $f_{THz}$. In this case, each antenna of the semiconductor element 100 is isolated (separated) from the antenna 100a in a path via a bias line including the lines 108a1 and 108a2 and the bias circuit $V_a$ at the frequency $f_{THz}$. As a result, the current of the resonance frequency $f_{THz}$ induced in each antenna is prevented from acting (affecting) on another adjacent antenna via the bias line. In addition, this configuration also reduces the interference between the electric field of the resonance frequency $f_{THz}$ standing in the antenna 100a and these power feeding members.

Each of the bias circuits $V_a$ and $V_b$ includes the shunt resistor 121, the wiring 122, the power supply 123, and the capacitor 124 (see FIG. 1D). The wiring 122 is illustrated as an inductor in FIG. 1D because the wiring 122 always includes a parasitic inductance component. The power supply 123 supplies bias signals needed to drive the RTD 101a and the RTD 101b. The voltage of the bias signal is typically selected from the voltage in the RTD differential negative resistance region used in the RTDs 101a and 101b. In the case of the antenna 100a, the bias voltages from the bias circuits $V_a$ and $V_b$ are supplied to the RTD 101a in the antenna 100a via the lines 108a1 and 108a2.

Here, the shunt resistor 121 and the capacitor 124 of each of the bias circuits $V_a$ and $V_b$ serve to reduce parasitic oscillation at a relatively low resonance frequency (typically in a frequency band from DC to 10 GHz) caused by the bias circuits $V_a$ and $V_b$. A value of the shunt resistor 121 is selected to be a value equal to or slightly smaller than an absolute value of the combined differential negative resistance of the RTDs 101a and 101b connected in parallel. Similarly to the shunt resistor 121, a value of the capacitor 124 is also set to have impedance equal to or slightly lower than an absolute value of the combined differential negative resistance of the RTDs 101a and 101b connected in parallel. That is, by providing these shunt elements, a bias circuit 120 is set to have impedance lower than an absolute value of the combined negative resistance corresponding to the gain in a frequency band from DC to 10 GHz. Generally, it is preferable that the capacitor 124 have a large value within the range described above, and in the present embodiment, a capacitance of approximately several tens of pF is used. The capacitor 124 is a de-coupling capacitor and may use, for example, a metal-insulator-metal (MIM) structure in which the antenna 100a and the substrate are integrally formed.

Description of Antenna Array

The semiconductor element 100 has an antenna array in which two antennas 100a and 100b are E-plane coupled. Each antenna individually oscillates a terahertz wave having a frequency $f_{THz}$. Adjacent antennas are mutually coupled by the coupling line 109 and are mutually injection-locked at the resonance frequency $f_{THz}$ of the terahertz wave.

The mutual injection locking means that all of the plurality of self-excited oscillators oscillate in pull-in synchronization by interaction. For example, the antenna 100a and the antenna 100b are mutually coupled by the coupling line 109. "Mutually coupled" refers to a phenomenon in which a current induced in a certain antenna acts on another adjacent antenna and changes transmission and reception characteristics of each other. By synchronizing the mutually coupled antennas with the same phase or the opposite phase, the electromagnetic field between the antennas is strengthened or weakened by the mutual injection-locking phenomenon, and the increase or decrease of the antenna gain can be adjusted.

The oscillation condition of the semiconductor element 100 having the antenna array can be determined based on the condition for mutual injection-locking in a configuration in which two or more individual RTD oscillators are coupled, which is described in J.Appl.Phys.,Vol.103,124514 (2008) (Non Patent Literature 3). Specifically, the oscillation condition of the antenna array in which the antenna 100a and the antenna 100b are coupled by the coupling line 109 will be considered. In this case, two oscillation modes of positive-phase mutual injection locking and opposite-phase mutual injection locking occur. The oscillation condition of the positive-phase mutual injection locking oscillation mode (even mode) is expressed by Equations (4) and (5), and the oscillation condition of the opposite-phase mutual injection locking oscillation mode (odd mode) is expressed by Equations (6) and (7).

Positive phase(even mode):frequency $f=f_{even}$ $Y_{even}=Y_{aa}+Y_{ab}+Y_{RTD}$ $$Re(Y_{even}) \leq 0 \qquad (4)$$

$$Im(Y_{even})=0 \qquad (5)$$

Opposite phase(odd mode):frequency $f=f_{odd}$ $Y_{odd}=Y_{aa}+Y_{ab}+Y_{RTD}$ $$Re(Y_{odd}) \leq 0 \qquad (6)$$

$$Im(Y_{odd})=0 \qquad (7)$$

In the above equations, $Y_{ab}$ represents mutual admittance between the antenna 100a and the antenna 100b. $Y_{ab}$ is proportional to a coupling constant representing the strength of coupling between the antennas. Ideally, it is preferable that the real part of $-Y_{ab}$ be large and the imaginary part be zero. In the semiconductor element 100 of the present embodiment, the coupling is performed under the condition of the positive-phase mutual injection locking, and the resonance frequency $f_{THz} \approx f_{even}$. Similarly, the other antennas are coupled by the coupling line 109 so as to satisfy the condition of the positive-phase mutual injection locking described above.

The coupling line 109 is constituted by a microstrip line having a structure in which the dielectric layer 104 is sandwiched between the third conductor layer 110 laminated on the dielectric layer 104 and the first conductor layer 106. In the semiconductor element 100, the antennas are coupled by DC coupling. In order to synchronize the antennas with each other at the resonance frequency $f_{THz}$, the third conductor layer 110, which is the upper conductor of the coupling line 109 that couples the antenna 100a and the antenna 100b, is directly connected to the second conductor layer 103a and to the second conductor layer 103b. In the semiconductor element 100, the third conductor layer 110 and the second conductor layers 103a and 103b are formed in the same layer.

With such a structure including the coupling line 109, the adjacent antennas 100a and 100b are coupled to each other and operate in synchronization with each other at the frequency $f_{THz}$ of the terahertz wave oscillated. In the antenna array synchronized by DC coupling, since the adjacent antennas can be synchronized by strong coupling, a synchronization operation by pull-in is easily performed, and variations in frequency and phase of each antenna are less likely to occur.

In the semiconductor element 100, the antenna array and the coupling line 109 are formed on the same substrate. The coupling line 109 is constituted by a microstrip line having a structure in which the dielectric layer 104 is sandwiched between the third conductor layers 110a, 110b, and 110c as well as conductor layers 152a and 152b and the first conductor layer 106 serving as GND. The third conductor layer 110a, the conductor layer 152a, the third conductor layer 110b, the conductor layer 152b, and the third conductor layer 110c are formed of the same material (Ti/Au (=5/300 nm)) in the same layer and are connected in this order. Each of the third conductor layers 110a, 110b, and 110c is 10 μm wide and 150 μm long, and a microstrip line having a characteristic impedance of 50Ω is formed. Each of the conductor layers 152a and 152b is 1 μm wide and 3 μm long, and a microstrip line having a characteristic impedance of 100Ω is formed.

The conductor layers 152a and 152b are disposed at positions corresponding to the antinodes of the electric field of a terahertz wave having a resonance frequency $f_{THz}$ standing in the coupling line 109. The microstrip line having the conductor layers 152a and 152b, which correspond to the second region 1092, as the upper conductors has impedance higher than that of the first regions and is configured such that only a frequency other than the operating frequency $f_{THz}$ and an out-of-phase component of the operating frequency $f_{THz}$ are selectively lost.

In the semiconductor element 100, the antennas are coupled by DC coupling so as to synchronize the antennas with each other at the resonance frequency $f_{THz}$. That is, the third conductor layers 110a and 110b, which are upper conductors of the coupling line 109 that couples the antennas 100a and 100b, are directly connected to the second conductor layers 103a and 103b, respectively, which are patch conductors of the antennas 100a and 100b. In the semiconductor element 100, the third conductor layers 110a and 110b and the second conductor layers 103a and 103b are formed in the same layer.

Here, the "positions corresponding to the antinodes of the electric field of a terahertz wave having a resonance frequency $f_{THz}$ standing in the coupling line 109" refer to, for example, positions where the electric field intensity of the terahertz wave having the resonance frequency $f_{THz}$ standing in the coupling line 109 is maximized. In other words, the positions refer to positions where the current intensity of the terahertz wave having the resonance frequency $f_{THz}$ standing in the coupling line 109 decreases by approximately one digit. As a result, occurrence of resonance (multi-mode resonance) in a plurality of frequency bands other than the frequency $f_{THz}$ and asynchronization due to phase shift between the antennas are reduced. If the dimension of each of the conductor layers 152a and 152b is too large, the resonance characteristics of the high-frequency electric field of the frequency $f_{THz}$ propagating through the coupling line are deteriorated, and the radiation efficiency is reduced due to a conductive loss. Therefore, it is preferable that the conductor layers 152a and 152b each have a width and length as small as possible and have a dimension that does not interfere with the resonance electric field, that is, typically, λ/10 or less is suitable.

Description of Comparison with Conventional Semiconductor Element

Figure 4A:
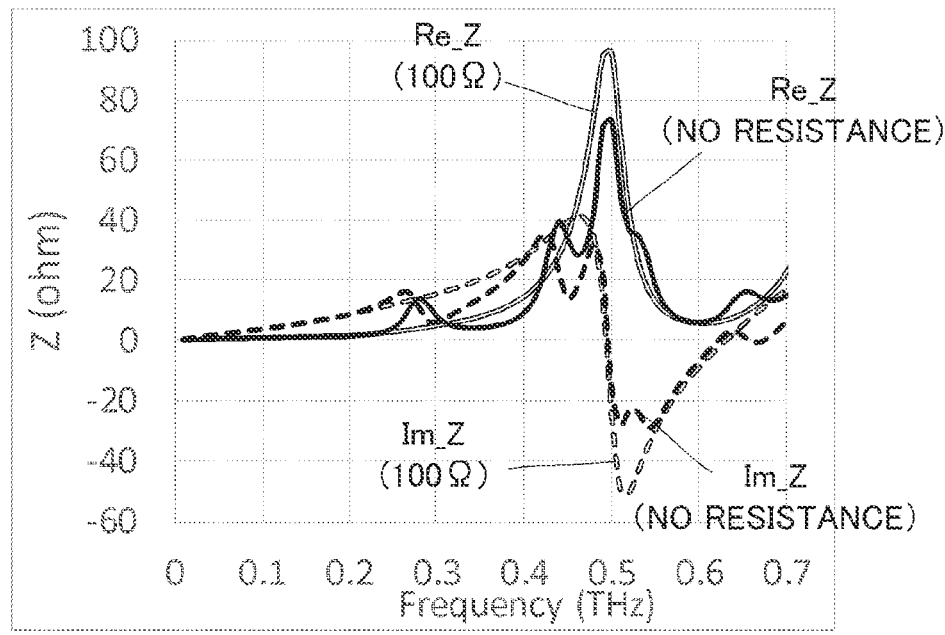
FIGS. 4A and 4B illustrate an analysis result of the semiconductor element 100.

FIG. 4A illustrates a comparison of analysis results between the impedance of the semiconductor element 100 according to the present embodiment and the impedance of a conventional semiconductor element. In the conventional semiconductor element, a coupling line does not have the second regions 152a and 152b having different impedance. For this analysis, HFSS manufactured by ANSYS, Inc., which is a high-frequency electromagnetic field solver using a finite element method, is used. Impedance Z corresponds to the inverse of $Y_{aa}$, which is the admittance of the entire structure of the antenna 100a. Z (100Ω) represents the impedance Z in the case where the second regions 152a and 152b have different impedance as in the present embodiment. Z (no resistance) represents the impedance Z in the conventional case. Re and Im represent a real part and an imaginary part, respectively, and resonance occurs at a frequency at which the impedance of the imaginary part is 0.

As illustrated in FIG. 4A, multi-peaks have occurred in the impedance of the conventional structure, and resonance modes are likely to occur in two frequency bands near 0.42 THz and 0.52 THz. In contrast, only a single peak has occurred at a desired resonance frequency $f_{THz}$=0.48 THz in the impedance of the semiconductor element 100 according to the present embodiment, that is, occurrence of multi-mode resonance is reduced. In addition, it can be seen that the semiconductor element 100 according to the present embodiment also provides an effect of suppressing the occurrence of resonance at the lower frequency band (0.3 THz or lower).

Figure 4B:
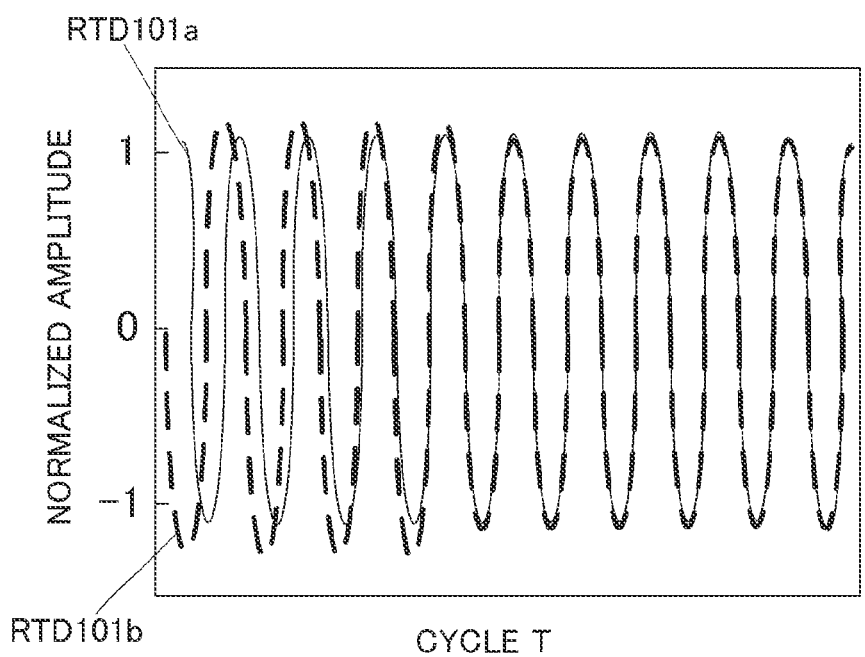

FIG. 4B illustrates an analysis example of mutual injection locking between the RTD 101a of the antenna 100a and the RTD 101b of the antenna 100b in the semiconductor element 100 according to the present invention. The horizontal axis represents time for 10 cycles, and the vertical axis represents normalized amplitude of voltages input to the RTD 101a and the RTD 101b. It can be seen that, even if there is a slight phase difference, by using the semiconductor element 100 of the present invention, the electromagnetic waves oscillated by the two RTDs gradually overlap in the same phase with time, and mutual injection locking starts.

In the semiconductor element 100, since the second region 1092 having different impedance is disposed in the coupling line 109, only a frequency other than a desired operating frequency $f_{THz}$ of the terahertz wave and an out-of-phase component of the operating frequency $f_{THz}$ are selectively lost. As a result, multi-mode resonance in a relatively high frequency band (typically from 10 GHz to 1000 GHz) can be suppressed, and only the resonance at the desired operating frequency fTHz of the terahertz wave can be selectively stabilized.

Therefore, according to the present embodiment, even when the number of antennas in the antenna array is increased, a single mode operation at the operating frequency $f_{THz}$ of the terahertz wave can be performed. As a result, the upper limit of the number of antennas to be arranged can be increased, and an effect of significant improvement in directivity and front strength accompanying an increase in the number of arrays can be expected. Therefore, according to the present embodiment, it is possible to provide the semiconductor element capable of efficiently generating or detecting a terahertz wave.

Modification 1

Figure 5A:
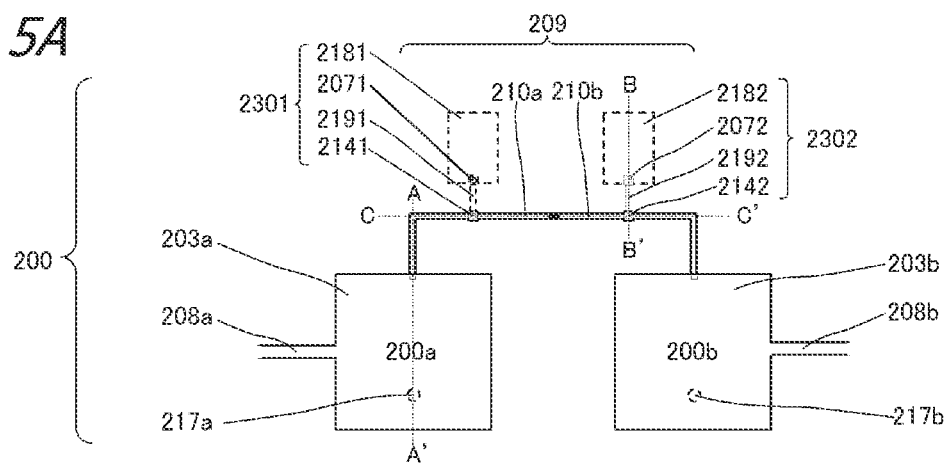
FIGS. 5A to 5D illustrate a configuration of a semiconductor element 200.
Figure 5B:
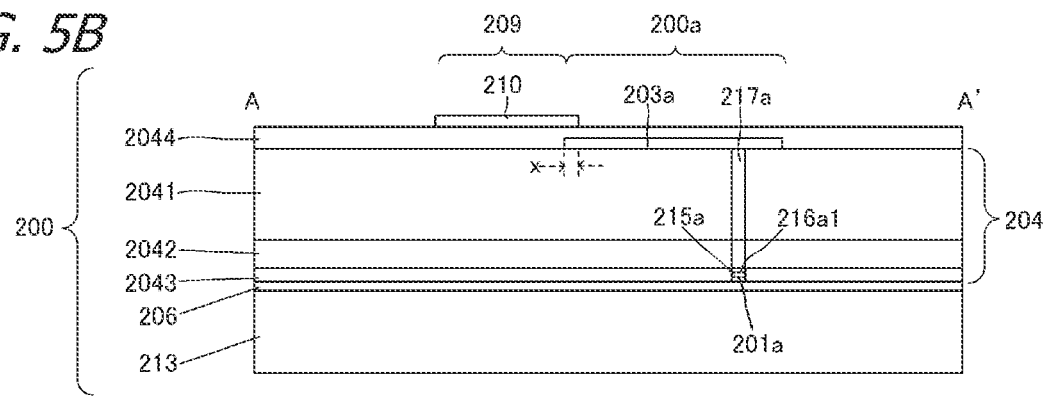
Figure 5C:
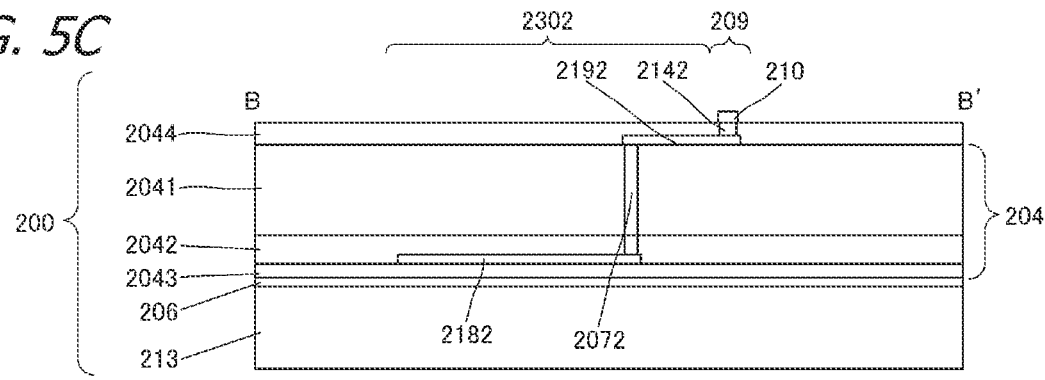
Figure 5D:
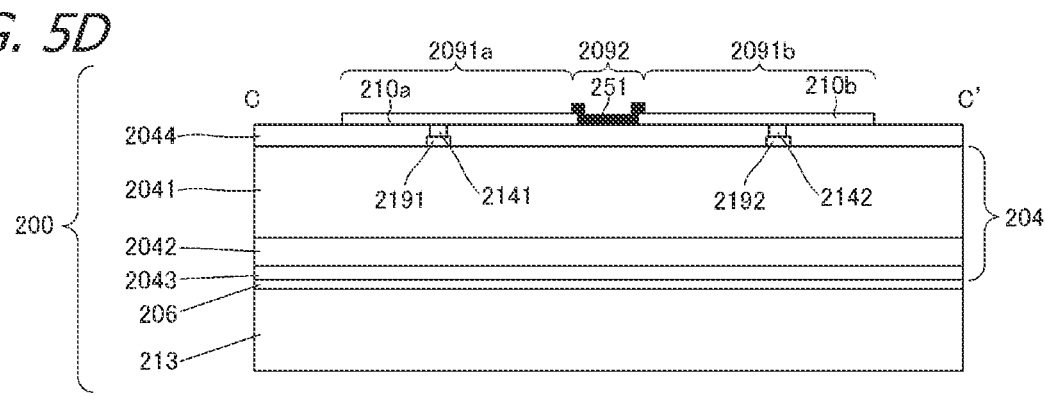

A semiconductor element 200 according to Modification 1 will be described with reference to FIGS. 5A to 5D. FIGS. 5A to 5D illustrate the semiconductor element 200 according to Modification 1. FIG. 5A is a top view of the semiconductor element 200. FIG. 5B is a cross-sectional view of the semiconductor element 200, taken along line A-A' in FIG. 5A. FIG. 5C is a cross-sectional view of the semiconductor element 200, taken along line B-B' in FIG. 5A. FIG. 5D is a cross-sectional view of the semiconductor element 200, taken along line C-C' in FIG. 5A.

The semiconductor element 200 includes an antenna array in which two antennas of antennas 200a and 200b are H-plane coupled. The semiconductor element 200 includes an antenna array in which antennas are coupled by AC coupling (capacitance coupling). In the configuration and structure of the antennas 200a and 200b, detailed descriptions of portions similar to those of the antennas 100a and 100b in the semiconductor element 100 will be omitted.

As illustrated in FIG. 5B, a coupling line 209 is constituted by a microstrip line having a structure in which a dielectric layer 204 and a fourth dielectric layer 2044 are sandwiched between a third conductor layer 210 and a first conductor layer 206. The dielectric layer 204 includes a first dielectric layer 2041, a second dielectric layer 2042, and a third dielectric layer 2043. Second conductor layers 203a and 203b are formed in a layer between the third conductor layer 210 and the first conductor layer 206. The third conductor layer 210, which is the upper conductor of the coupling line 209 that couples the antenna 200a and the antenna 200b, overlaps the second conductor layers 203a and 203b by a length x=5 μm near the radiation end when viewed from the lamination direction (in a plan view). In the overlapping portion, the second conductor layers 203a and 203b, the fourth dielectric layer 2044, and the third conductor layer 210 are laminated in this order. Thus, a metal-insulator-metal (MIM) capacitance structure in which the second conductor layers 203a and 203b and the third conductor layer 210 sandwich the fourth dielectric layer 2044 is formed. A DC open state is formed between the second conductor layer 203a and the second conductor layer 203b, and the magnitude of the coupling is small in a low-frequency range below the resonance frequency $f_{THz}$ so that inter-element isolation is ensured. The magnitude of the coupling between the antennas in the band of the resonance frequency $f_{THz}$ can be adjusted by the capacitance.

In the semiconductor element 200, shunt elements 2301 and 2302 are connected to the coupling line 209. The shunt elements 2301 and 2302 are connected to the coupling line 209 through vias 2141 and 2142, respectively. The vias 2141 and 2142 are connected to the third conductor layer 210 at nodes of the high-frequency electric field of the resonance frequency $f_{THz}$ standing in the coupling line 209. As a result, short-circuiting can be achieved at a frequency other than the resonance frequency $f_{THz}$ of the terahertz wave so that occurrence of multi-mode resonance is reduced.

The third conductor layer 210 of the coupling line 209 and resistor layers 2191 and 2192 laminated on the first dielectric layer 2041 are connected to each other through the vias 2141 and 2142 formed in the fourth dielectric layer 2044. The resistor layers 2191 and 2192 are connected to fourth conductor layers 2181 and 2182 laminated on the third dielectric layer 2043 through vias 2071 and 2072 formed in the first dielectric layer 2041.

An MIM capacitance structure in which the third dielectric layer 2043 is sandwiched between the fourth conductor layers 2181 and 2182 and the first conductor layer 206 is formed. Such an AC coupling structure that can weaken the coupling between the antennas leads to reduction of the transmission loss between the antennas, and the radiation efficiency of the antenna array is expected to be improved. There are cases where the vias 2071 and 2072 have a large width because the vias 2071 and 2072 are formed inside the first dielectric layer 2041 having a relatively large thickness. However, by disposing the vias 2071 and 2072 at the locations away from the coupling line 209 as in the present modification, even if the vias 2071 and 2072 have a large width (typically λ/10 or more), interference with the resonance electric field of the antenna is suppressed. As a result, the antenna gain can be improved.

In FIGS. 5A and 5D, first regions 2091a and 2091b of the coupling line 209 are microstrip lines having a structure in which the dielectric layer 204 is sandwiched between the third conductor layers 210a and 210b and the first conductor layer 206. A second region 2092 is a microstrip line having a structure in which the dielectric layer 204 is sandwiched between the upper conductor of a resistance layer 251 and the first conductor layer 206. The resistance layer 251 is disposed between the third conductor layers 210a and 210b and electrically and physically connected to each other to form the coupling line 209 (microstrip line). The third conductor layers 210a and 210b are made of Ti/Au, whereas the resistance layer 251 is made of a material (TiW) having a high resistivity. Therefore, the second region 2092 has higher impedance and larger loss than the first regions 2091a and 2091b.

EXAMPLE 1

As Example 1, a specific configuration of the semiconductor element 100 according to Embodiment 1 will be described with reference to FIGS. 3A to 3C. The semiconductor element 100 is a semiconductor device capable of single mode oscillation in a frequency band of 0.45 to 0.50 THz.

RTDs 101a and 101b have a multi-quantum well structure of InGaAs/AlAs lattice-matched on an InP substrate 113, and in the present example, an RTD having a double-barrier structure is used. The semiconductor heterostructure of this RTD is described in J Infrared Milli Terahz Waves (2014) 35:425-431 (Non Patent Literature 4). The RTDs 101a and 101b have current-voltage characteristics in which, as measured values, peak current density is 9 mA/μm$^2$ and differential negative conductance per unit area is 10 mS/μm$^2$.

An antenna 100a has a mesa structure that includes a semiconductor layer 115a, which includes the RTD 101a, and an electrode 116a, which is an ohmic electrode. In the present example, a circular mesa structure having a diameter of 2 μm is formed. The magnitude of the differential negative resistance of the RTD 101a is approximately −30Ω per diode. In this case, the differential negative conductance (GRTD) of the semiconductor layer 115a including the RTD 101a is estimated to be approximately 30 mS, and the diode capacitance ($C_{RTD}$) of the RTD 101a is estimated to be approximately 10 fF.

The antenna 100a is a patch antenna having a structure in which a dielectric layer 104 is sandwiched between a second conductor layer 103a, which is a patch conductor, and a first conductor layer 106, which is a ground conductor. The semiconductor layer 115a including the RTD 101a is integrated in the antenna 100a. The antenna 100a is a square patch antenna in which one side of the second conductor layer 103a is 150 μm, and a resonator length L of the antenna is 150 μm. As the second conductor layer 103a and the first conductor layer 106, a metallic layer mainly formed of an Au thin film having low resistivity is used.

The dielectric layer 104 is disposed between the second conductor layer 103a and the first conductor layer 106. The dielectric layer 104 includes three layers of a first dielectric layer 1041, a second dielectric layer 1042, and a third dielectric layer 1043. The first dielectric layer 1041 is formed of 5 μm-thick BCB (benzocyclobutene, manufactured by the Dow Chemical Company, $ε_{r1}$=2). The second dielectric layer 1042 is formed of 2 μm-thick SiO$_2$ (plasma CVD, $ε_{r2}$=4). The third dielectric layer 1043 is formed of 0.1 μm-thick SiN$_x$ (plasma CVD, $C_{r3}$=7). That is, in the present example, the three dielectric layers included in the dielectric layer 104 are made of different materials.

The first conductor layer 106 includes a Ti/Pd/Au layer (20/20/200 nm) and a semiconductor formed of an n+–InGaAs layer (100 nm) having an electronic concentration of $1 \times 10^{18}$ cm$^{-3}$ or more. In the first conductor layer 106, the metal and the semiconductor are connected to each other by low-resistance ohmic contact.

The electrode 116a is an ohmic electrode formed of a Ti/Pd/Au layer (20/20/200 nm). The electrode 116a is connected by low-resistance ohmic contact to the semiconductor formed of an n+–InGaAs layer (100 nm) that is formed in the semiconductor layer 115a and has an electronic concentration of $1 \times 10^{18}$ cm$^{-3}$ or more.

In the structure around the RTD 101a in the lamination direction, the substrate 113, the first conductor layer 106, the semiconductor layer 115a including the RTD 101a, the electrode 116a, a conductor 117a, and the second conductor layer 103a are laminated in this order from the substrate 113 side and are electrically connected to each other. The conductor 117a is formed of a conductor containing Cu (copper).

The RTD 101a is disposed at a position shifted by 40% (60 μm) from the center of gravity of the second conductor layer 103a in the resonance direction (A-A' direction). The input impedance at the time of feeding a high-frequency wave from the RTD to the patch antenna is determined by the position of the RTD 101a in the antenna 100a. The second conductor layer 103a is connected to lines 1081a1 and 108a2.

The lines 108a1 and 108a2 are formed of a metallic layer including Ti/Au (=5/300 nm) laminated on the first dielectric layer 1041 and connected to bias circuits $V_a$ and $V_b$. The antenna 100a is designed to be able to obtain oscillation of a power of 0.2 mW at a frequency $f_{THz}$=0.48 THz by setting a bias in the negative resistance region of the RTD 101a. The lines 108a1 and 108a2 are each composed of a metallic layer pattern including Ti/Au (=5/300 nm) having a length of 75 μm in the resonance direction (=A-A' direction) and a width of 10 μm. The lines 108a1 and 108a2 are each connected to the second conductor layer 103a at the center in the resonance direction (=A-A' direction) and at the edge in the B-B' direction of the second conductor layer 103a. The connection positions correspond to nodes of the electric filed of a terahertz wave of a frequency $f_{THz}$ standing at the antenna 100a.

The semiconductor element 100 includes an antenna array in which two antennas of the antenna 100a and the antenna 100b are aligned in an electric field direction (=E-plane direction) of radiated electromagnetic waves and are coupled to each other. The individual antenna is designed to singly oscillate a terahertz wave having a frequency $f_{THz}$ and is arranged at a pitch of 340 μm in the A-A' direction. The adjacent antennas are mutually coupled by a coupling line 109 including a third conductor layer 110 made of Ti/Au (=5/300 nm). More specifically, the second conductor layer 103a and the second conductor layer 103b are connected by the third conductor layer 110, which is 5 μm wide and 190 μm long. The antenna 100a and the antenna 100b are mutually injection-locked at the resonance frequency $f_{THz}$=0.48 THz in a state where the phases are aligned with each other (positive phase) to oscillate.

In the semiconductor element 100, the coupling line 109 is constituted by a microstrip line having a structure in which the dielectric layer 104 is sandwiched between third conductor layers 110a, 110b, and 110c and conductor layers 152a and 152b and the first conductor layer 106 serving as GND. The third conductor layer 110a, the conductor layer 152a, the third conductor layer 110b, the conductor layer 152b, and the third conductor layer 110c are formed of the same material (Ti/Au (=5/300 nm)) in the same layer and are connected in this order. Each of the third conductor layers 110a, 110b, and 110c is 10 µm wide and 150 µm long. Each of the conductor layers 152a and 152b is 1 µm wide and 3 µm long, and the microstrip line having a characteristic impedance of 20Ω is formed.

The conductor layers 152a and 152b are disposed at positions corresponding to the antinodes of the electric field of a terahertz wave having a resonance frequency $f_{THz}$ standing in the coupling line 109. The microstrip line having the conductor layers 152a and 152b, which correspond to the second region 1092, as the upper conductors has impedance higher than that of the first regions and is configured such that only a frequency other than the operating frequency $f_{THz}$ and an out-of-phase component of the operating frequency $f_{THz}$ are selectively lost. The third dielectric layer 1043 is formed of 0.1 µm-thick silicon nitride ($\varepsilon_{r3}$=7). Here, the frequency band in which a frequency other than the operating frequency $f_{THz}$ and an out-of-phase component of the operating frequency $f_{THz}$ are selectively lost is, for example, from 10 GHz to 1000 GHz.

Power is supplied to the semiconductor element 100 from the bias circuits $V_a$ and $V_b$, and normally, a bias voltage in a differential negative resistance region is applied so as to supply a bias current. In the case of the semiconductor element 100 disclosed in the present example, radiation of a terahertz electromagnetic wave of 0.4 mW at a frequency of 0.48 THz is obtained by an oscillation operation in a negative resistance region.

As described above, according to the present example, compared with the related art, the loss of the electromagnetic wave can be further reduced, and the terahertz wave can be oscillated or detected with higher efficiency.

OTHER EXAMPLES

While the preferred embodiments and examples of the present invention have thus been described, the present invention is not limited to these embodiments and examples, and various modifications and variations can be made without departing from the gist of the present invention. For example, in the above embodiments and examples, the descriptions have been made assuming the case where carriers are electrons. However, the present invention is not limited thereto, and positive holes may be used. In addition, the materials of the substrate and the dielectrics may be selected depending on the application, and a semiconductor such as silicon, gallium arsenide, indium arsenide, or gallium phosphide, or a resin such as glass, ceramic, polytetrafluoroethylene, or polyethylene terephthalate can be used. The above-described structures and materials in the embodiments and examples may be appropriately selected in accordance with a desired frequency or the like.

Further, in the above-described embodiments and examples, the square patch antenna is used as the resonator for the terahertz wave. However, the shape of the resonator is not limited thereto, and for example, a resonator having a structure using a patch conductor with a polygonal shape such as a rectangular shape and a triangular shape, a circular shape, an elliptical shape, or the like may be used.

The number of differential negative resistance elements integrated in the semiconductor element is not limited to one, and a resonator having a plurality of differential negative resistance elements may be used. The number of lines is not limited to one, and a plurality of lines may be used.

In the above description, the double-barrier RTD made of InGaAs/AlAs grown on the InP substrate has been described as an RTD. However, the present invention is not limited to these structures and material systems, and other structures and combinations of materials may be used. For example, an RTD having a triple-barrier quantum well structure or an RTD having a multiple-barrier quantum well structure having four or more barriers may be used.

In addition, each of the following combinations may be used as the material of the RTD.
GaAs/AlGaAs/ and GaAs/AlAs, InGaAs/GaAs/AlAs formed on a GaAs substrate
InGaAs/InAlAs, InGaAs/AlAs, InGaAs/AlGaAsSb formed on an InP substate
InAs/AlAsSb and InAs/AlSb formed on an InAs substrate
SiGe/SiGe formed on an Si substrate According to the present invention, more efficient generation or detection of a terahertz wave can be realized by an element including a plurality of antennas.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The invention claimed is:

1. A semiconductor element comprising:
   an antenna array that is provided with a plurality of antennas each including a semiconductor layer having an electromagnetic wave gain or carrier nonlinearity with respect to a terahertz wave; and
   a coupling line that synchronizes adjacent antennas in the antenna array with each other at a frequency of the terahertz wave,
   wherein the coupling line includes a plurality of first regions connected to the adjacent antennas respectively and a second region provided between the plurality of first regions,
   wherein the second region has impedance different from impedance of each of the first regions, and
   wherein the second region has a loss larger than a loss of each individual first region at a frequency other than a resonance frequency of the antenna array.

2. The semiconductor element according to claim 1, wherein the plurality of antennas each include
   a substrate,
   a first conductor layer laminated on the substrate,
   the semiconductor layer electrically connected to the first conductor layer,
   a second conductor layer electrically connected to the semiconductor layer and faces the first conductor layer, and
   a dielectric layer formed between the first conductor layer and the second conductor layer.

3. The semiconductor element according to claim 2, further comprising a third conductor layer,
   wherein the coupling line has a structure in which the dielectric layer is sandwiched between the third conductor layer and the first conductor layer.

4. The semiconductor element according to claim 3, wherein the third conductor layer in the second region has resistance higher than resistance of the third conductor layer in the first region.

5. The semiconductor element according to claim 3, wherein the third conductor layer in the second region has resistivity higher than resistivity of the third conductor layer in the first region.

6. The semiconductor element according to claim 3, wherein the third conductor layer in the second region has a width smaller than a width of the third conductor layer in the first region.

7. The semiconductor element according to claim 3, wherein the third conductor layer in the second region has a thickness smaller than a thickness of the third conductor layer in the first region.

8. The semiconductor element according to claim 1, wherein the second region includes a structure having capacitance higher than capacitance of the first region.

9. The semiconductor element according to claim 1, wherein the second region includes a structure having impedance lower than impedance of the first region.

10. The semiconductor element according to claim 2, wherein the dielectric layer includes a second dielectric in the second region and a first dielectric in the first region, and
wherein the second dielectric is made of a material having a loss larger than a loss of the first dielectric at a high frequency.

11. The semiconductor element according to claim 2, wherein the dielectric layer includes a second dielectric in the second region and a first dielectric in the first region, and
wherein the second dielectric has a layer thickness smaller than a layer thickness of the first dielectric.

12. The semiconductor element according to claim 1, wherein the second region is disposed at an antinode of an electric field of the terahertz wave having a resonance frequency in the coupling line.

13. The semiconductor element according to claim 1, wherein the antenna array and the coupling line are formed on the same substrate.

14. The semiconductor element according to claim 1, wherein each of the antennas is a patch antenna.

15. The semiconductor element according to claim 1, wherein the coupling line is a microstrip line.

16. The semiconductor element according to claim 1, wherein the semiconductor layer includes a negative resistance semiconductor element.

17. The semiconductor element according to claim 16, wherein the negative resistance semiconductor element is a resonant tunneling diode.

18. The semiconductor element according to claim 1, wherein
the coupling line is connected to a shunt element connected in parallel with each of the semiconductor layers of the adjacent antennas, and
the shunt element is connected to a node of the electric field of the terahertz wave having the resonance frequency in the coupling line.

19. The semiconductor element according to claim 1, wherein the plurality of antennas are each connected to a bias circuit including a power supply that supplies a bias signal to the semiconductor layer.

20. The semiconductor element according to claim 1, wherein the terahertz wave is an electromagnetic wave in a frequency range of at least 30 GHz and not more than 30 THz.

* * * * *